(12) United States Patent  
Ui et al.

(10) Patent No.: US 8,821,684 B2  
(45) Date of Patent: Sep. 2, 2014

(54) SUBSTRATE PLASMA PROCESSING APPARATUS AND PLASMA PROCESSING METHOD

(75) Inventors: Akio Ui, Tokyo (JP); Naoki Tamaoki, Tokyo (JP); Takashi Ichikawa, Saitama (JP); Hisataka Hayashi, Yokohama (JP); Takeshi Kaminatsui, Yokohama (JP); Shinji Himori, Nirasaki (JP); Norikazu Yamada, Nirasaki (JP); Takeshi Ohse, Niarasaki (JP); Jun Abe, Nirasaki (JP)

(73) Assignees: Kabushiki Kaisha Toshiba, Tokyo (JP); Tokyo Electron Limited, Tokyo (JP)

( * ) Notice: Subject to any disclaimer, the term of this patent is extended or adjusted under 35 U.S.C. 154(b) by 836 days.

(21) Appl. No.: 12/363,070

(22) Filed: Jan. 30, 2009

(65) Prior Publication Data

US 2009/0194508 A1 Aug. 6, 2009

(30) Foreign Application Priority Data

Feb. 1, 2008 (JP) ................ P2008-023066

(51) Int. Cl.
*C23F 1/00* (2006.01)
*C23C 16/50* (2006.01)
*H01L 21/306* (2006.01)
*H01J 37/32* (2006.01)

(52) U.S. Cl.
CPC ..... *H01J 37/32027* (2013.01); *H01J 37/32091* (2013.01); *H01J 37/32045* (2013.01)
USPC .............. 156/345.44; 156/345.28; 118/723 E

(58) Field of Classification Search
USPC ............. 156/345.43, 345.44, 345.45, 345.46, 156/345.47; 118/715, 722, 723 R, 723 E; 315/111.21
See application file for complete search history.

(56) References Cited

U.S. PATENT DOCUMENTS

| 6,089,181 | A | | 7/2000 | Suemasa et al. |
| 6,110,287 | A | * | 8/2000 | Arai et al. ................ 156/345.34 |
| 6,197,151 | B1 | | 3/2001 | Kaji et al. |
| 6,465,376 | B2 | * | 10/2002 | Uzoh et al. .................... 438/627 |

(Continued)

FOREIGN PATENT DOCUMENTS

| CN | 1842242 A | 10/2006 |
| EP | 1 708 241 A1 | 10/2006 |

(Continued)

OTHER PUBLICATIONS

English Machine Translation of JP 2004-076069. Obtained from http://www19.ipdl.inpit.go.jp/PA1/cgi-bin/PA1INDEX on Jan. 26, 2012.*

(Continued)

*Primary Examiner* — Maureen Gramaglia
(74) *Attorney, Agent, or Firm* — Finnegan, Henderson, Farabow, Garrett & Dunner, L.L.P.

(57) ABSTRACT

A substrate plasma processing apparatus includes a substrate holding electrode and a counter electrode which are arranged in a chamber, a high frequency generating device which applies a high frequency of 50 MHZ or higher to the substrate holding electrode, a DC negative pulse generating device which applies a DC negative pulse voltage in a manner of superimposing on the high frequency, and a controller controlling to cause intermittent application of the high frequency and cause intermittent application of the DC negative pulse voltage according to the timing of on or off of the high frequency.

5 Claims, 13 Drawing Sheets

(56) References Cited

U.S. PATENT DOCUMENTS

| | | |
|---|---|---|
| 6,902,683 B1 | 6/2005 | Kaji et al. |
| 2001/0023822 A1* | 9/2001 | Koizumi et al. ......... 204/298.05 |
| 2004/0219797 A1* | 11/2004 | Honda et al. .................. 438/709 |
| 2005/0039854 A1* | 2/2005 | Matsuyama et al. ..... 156/345.44 |
| 2005/0082256 A1* | 4/2005 | Honda et al. .................... 216/67 |
| 2005/0103441 A1* | 5/2005 | Honda et al. ............. 156/345.47 |
| 2007/0029194 A1 | 2/2007 | Matsumoto et al. |
| 2008/0053818 A1* | 3/2008 | Ui ................................ 204/164 |
| 2008/0057222 A1* | 3/2008 | Ui ................................ 427/570 |
| 2008/0237185 A1* | 10/2008 | Ui et al. .......................... 216/67 |
| 2009/0078678 A1 | 3/2009 | Kojima et al. |

FOREIGN PATENT DOCUMENTS

| | | | |
|---|---|---|---|
| JP | 2001-207259 | | 7/2001 |
| JP | 2003-234331 | | 8/2003 |
| JP | 2004076069 A | * | 3/2004 |
| JP | 2004-323973 | | 11/2004 |
| JP | 2005-126257 | | 5/2005 |
| JP | 2005-259873 | | 9/2005 |
| JP | 2008085288 A | * | 4/2008 |
| TW | 355812 | | 4/1999 |
| TW | 454258 | | 9/2001 |

OTHER PUBLICATIONS

Wang, et al., "Control of ion energy distribution at substrates during plasma processing", Journal of Applied Physics, vol. 88, No. 2, pp. 643-646, (Jul. 15, 2000).*

Chen, et al., "Fluid modeling of electron heating in low-pressure, high-frequency capacitively coupled plasma discharges", Journal of Applied Physics, vol. 96, No. 11, pp. 6073-6081, (Dec. 1, 2004).*

Malyshev, et al., "Dynamics of pulsed-power chlorine plasmas", Journal of Applied Physics, vol. 86, No. 9, pp. 4813-4820, (Nov. 1, 1999).*

Samukawa, et al., "Time-modulated electron cyclotron resonance plasma discharge for controlling generation of reactive species", Appl. Phys. Lett. 63 (15), pp. 2044-2046, (Oct. 11, 1993).*

Sugai, et al., "Diagnostics and control of radicals in an inductively coupled etching reactor", J. Vac. Sci. Technol. A, 13(3), pp. 887-893, (May/Jun. 1995).*

Ho, et al., "Modeling the plasma chemistry of C2F6 and CHF3 etching of silicon dioxide, with comparisons to etch rate and diagnostic data", J. Vac. Sci. Technol. A, vol. 19, Issue 5, 1 page, (Sep. 2001).*

Office Action issued by the Taiwanese Patent Office on Oct. 12, 2012, for Taiwanese Patent Application No. 098103149, and English-language translation thereof.

* cited by examiner

FIG. 10A
DC PULSE APPLICATION
SEQUENTIAL DC NEGATIVE PULSE SUPERPOSITION
INTERMITTENT OPERATION OF DC NEGATIVE PULSE
FIG. 10B
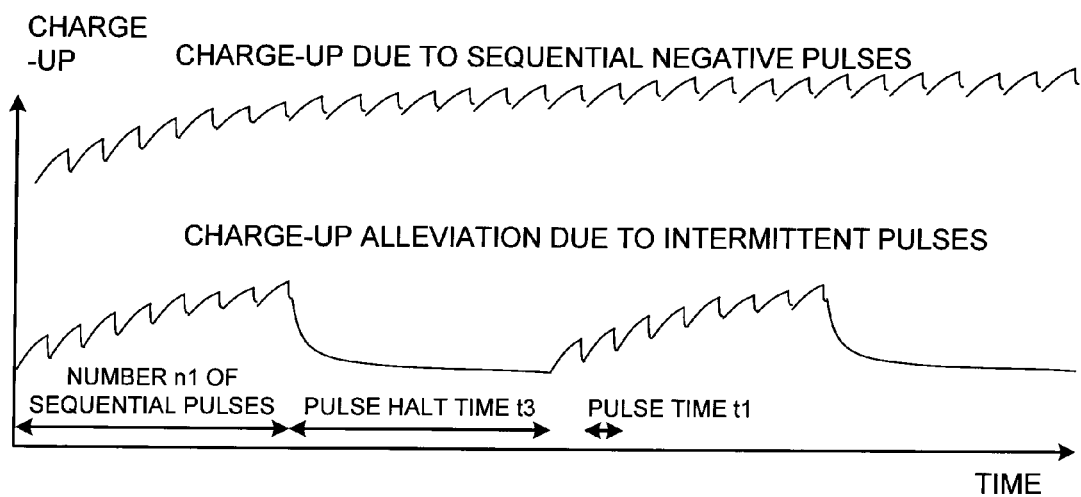

PRIOR ART

PRIOR ART

PRIOR ART

SUBSTRATE PLASMA PROCESSING APPARATUS AND PLASMA PROCESSING METHOD

CROSS-REFERENCE TO THE APPLICATIONS

This application is based upon and claims the benefit of priority from the prior Japanese Patent Application No. 2008-023066, filed on Feb. 1, 2008; the entire contents of which are incorporated herein by reference.

BACKGROUND OF THE INVENTION

1. Field of the Invention

The present invention relates to a substrate plasma processing apparatus of what is called a parallel plate type and a substrate plasma processing method, in which an RF electrode and a counter electrode are arranged facing each other in a vacuum chamber and a substrate held on the RF electrode is processed with plasma generated between the electrodes.

2. Description of the Related Art

When wiring or the like is performed on a substrate such as a semiconductor wafer, it is necessary to perform minute processing on the substrate. For this purpose, conventionally a plasma processing apparatus using plasma has been used frequently.

FIG. 11 is a diagram schematically showing the structure of an example of such a conventional substrate plasma processing apparatus.

The substrate plasma processing apparatus 10 shown in FIG. 11 is a plasma processing apparatus of what is called a parallel plate type. In the substrate plasma processing apparatus 10, a high frequency (RF) electrode 12 and a counter electrode 13 are arranged facing each other in a chamber 11. On a main surface of the RF electrode 12 that faces the counter electrode 13, a substrate S to be subjected to processing is held. A gas to be used for generating plasma and thereby for processing the substrate S is introduced from a gas introducing pipe 14 into the chamber 11 as shown by arrows. Along with this, a not-shown vacuum pump is used to evacuate the inside of the chamber 11 from an exhaust port 15. At this time, the pressure inside the chamber 11 is approximately 1 Pa for example.

Next, an RF (voltage) is applied to the RF electrode 12 via a matching device 16 from a commercial RF power supply 17 of 13.56 MHz. Thus, plasma is generated between the RF electrode 12 and the counter electrode 13.

At this time, positive ions in the plasma P are incident at high speed on the substrate S on the RF electrode 12 by a negative self-bias potential Vdc generated on the RF electrode 12. Consequently, the substrate incident energy at this time is used to induce surface reaction on the substrate S to thereby perform plasma substrate processing such as reactive ion etching (RIE), plasma chemical vapor deposition (PCVD), sputtering, ion implantation, or the like. Particularly, from a viewpoint of processing a substrate, RIE is mainly used. Therefore, the explanation below will be given mainly focusing on substrate processing using RIE in particular.

In the plasma processing apparatus as shown in FIG. 11, Vdc (average substrate incident energy) increases as the RF power increases as shown in FIG. 12. Accordingly, adjustment of the Vdc mainly by RF power is performed for adjusting a processing rate and adjusting a processing shape. Further, the Vdc can be partially adjusted also by the pressure or electrode shape on which the Vdc depends.

FIG. 13 shows a result of simulating parallel plate type Ar plasma with a frequency of 13 MHz, Vrf=160 V, pressure of 6.6 Pa, 30 mm distance between electrodes and 300 mm wafer size by a continuum model plasma simulator (G. Chen, L. L. Raja, J. Appl. Phys. 96, 6073 (2004)) to obtain an ion energy distribution. Further, FIG. 14 is a graph showing a distribution status of ion energy that is suitable for RIE of the substrate S.

The incident energy onto the substrate S exhibits an ion energy distribution as shown in FIG. 13. As is clear from FIG. 13, the ion energy in the plasma generated in the apparatus as shown in FIG. 11 is divided in two, a low energy side peak and a high energy side peak, and an energy width $\Delta E$ thereof becomes as wide as a few tens to a few hundreds eV depending on the plasma generating condition. Therefore, even when Vdc is adjusted to energy that is optimum for substrate processing, there exist ions having energy that is too high (high energy side peak) and ions having energy that is too low (low energy side peak) among ions incident on the substrate as shown in FIG. 14.

Therefore, in RIE for example, when substrate processing is implemented with ions having energy equivalent to the high energy side peak, there is a tendency to cause shoulder cutting (shoulder dropping) and deteriorate the processing shape. On the other hand, when substrate processing is implemented with ions having energy equivalent to the low energy side peak, it is equal to or lower than a surface reaction threshold and contributes nothing to the substrate processing or tends to deteriorate the processing shape accompanying deterioration of anisotropy (the ion incident angle widens by thermal velocity).

In such a viewpoint, in semiconductor processes in these days, it is necessary to narrow the band of the ion energy (realization of small $\Delta E$) as shown by hatching at a substantially center portion in FIG. 14 and to optimally adjust an average energy value (optimization of Vdc) so as to finely control the processing shape corresponding to RIE of semiconductor devices, various films, and composite films, which are shrinking more and more.

To narrow the band of the ion energy, use of higher RF frequencies (for example, refer to JP-A 2003-234331 (KOKAI)) and use of pulse plasma (for example, refer to J. Appl. Phys. Vol. 88, No. 2, 643 (2000)) are considered.

Further, the plasma generation is roughly classified into an inductive coupling type and a capacitive coupling type. From a viewpoint of fine control of processing shape, it is effective to shorten a residence time by reducing the plasma volume so as to suppress secondary reaction. In such a viewpoint, the parallel plate type plasma of capacitive coupling type is more advantageous as compared to the inductive coupling type plasma with a large volume.

Further, for the purpose of improving controllability of Vdc and plasma density, there has been invented a method to introduce RFs with two different frequencies to parallel plate electrodes for independently controlling plasma density with a high frequency (100 MHz for example) RF and Vdc by a low frequency (3 MHz for example) RF (for example, refer to JP-A 2003-234331 (KOKAI)). In this case, in addition to a high frequency power supply and a high frequency matching device, there are provided a low frequency power supply and a low frequency matching device, thereby allowing superimposing of the aforementioned high frequency RF and low frequency RF with respect to the RF electrode.

In viewpoints of cleaning process and process stabilization, it is advantageous that the counter electrode is at the ground potential. When an RF is applied to the counter electrode, the counter electrode is scraped by Vdc generated on the counter electrode surface, which becomes a dust source or a source of unstableness for the process. Therefore, the two RFs are superimposed for the RF electrode on which the substrate is disposed.

Further, by pulsing of RF, there are attempted lowering of electron temperature (for example, refer to J. Appl. Phys. Vol. 86, No 9, pp 4813-4820 (1999)), suppressing of density of radicals disturbing the process (for example, fluorine radicals) (for example, refer to App. Phys. Lett., Vol. 63, No 15, pp. 2045-2046 (1993)), and improving selectivity of plasma etching (for example, a ratio of etching rate of silicon oxide/silicon) (for example, refer to J. Vac. Sci. Technol. A 13, pp 887-893 (1995)).

As described above, conventionally it has been attempted to suppress plasma damage due to lowering of electron temperatures or the like by pulsing of a high frequency RF (HF), or superimposedly applying a high frequency RF (HF) and a low frequency RF (LF) to control radical density.

Further, the present inventors are considering applying DC negative pulses and a high frequency RF (HF) superimposedly. In this technique, by superimposedly applying DC negative pulses, the band of positive ion energy becomes narrow and easily controllable to an energy band that is desirable for a process, thereby improving processing accuracy of plasma etching, suppressing plasma damage, and improving an embedding characteristic of plasma CVD. On the other hand, the radical density is controlled by pulsing of HF (RF), and it is expected that plasma damage due to reduction of electron temperature is suppressed.

By superimposedly applying the DC negative pulses and the pulsed high frequency RF (HF), for example F radical density decreases (isotropic etching decreases) in anisotropic etching of an oxide film by a $CF_4$ gas, anisotropic etching by ion radicals of $CF_3^+$ or the like increases, and moreover the ion energy is controlled to a narrow band. Further, the radical density of $CF_2$ or the like increases, which becomes a generation source of a side wall protective film (facilitation of anisotropy). With these radical species selecting effect and energy selecting effect, remarkable improvement in processing performance together with improvement in process controllability are realized.

However, as shown in FIGS. 7A and 7B which will be explained later (analytical results of simulating plasma density, electron temperature, and time variation of a process when a pulsed HF and DC negative pluses are applied superimposedly), the electron temperature lowers in a quite short time ($5 \times 10^{-6}$ seconds or shorter) as the high frequency power (HF) turns off, and generation of ions and electrons by electronic collision and ionization stops. In this what is called an afterglow state, when the DC negative pulses are applied, electrons and ions in the plasma are drawn out of the plasma, and the plasma becomes unstable and disappears. The disappearance of the plasma causes reduction of the process rate, device damage when reignition, and process unstabilization. Further, as shown in FIG. 9, when processing an insulator 100 such as an oxide film or a nitride film using the DC negative pulses, it is possible that a charge-up due to insufficiency of electrons occurs in a bottom portion 102 of a trench 101. When such a charge-up occurs, it then causes deterioration of processing shape due to ion drflection, etching stop, or damage to the device due to a charge voltage.

The present invention is made in view of the above-described conventional situation, and an object thereof is to provide a substrate plasma processing apparatus and a substrate plasma processing method which, in a plasma processing apparatus of what is called a parallel plate type, increase radical species density that is suitable for processing a substrate, and are capable of controlling the ion radical energy to an energy value and a narrow energy band which are suitable for processing a substrate to thereby perform fine processing, and further performing excellent embedding film forming.

BRIEF SUMMARY OF THE INVENTION

One aspect of a substrate plasma processing apparatus according to the present invention includes a chamber capable of maintaining a vacuum therein, a first electrode to hold a substrate in the chamber, the substrate being processed on a main surface thereof, a counter electrode arranged to face the first electrode in the chamber, a first supply unit configured to apply a high frequency power having a predetermined frequency of 50 MHz or higher to the first electrode, a second supply unit configured to apply a predetermined DC negative pulse voltage in a manner of superimposing on the high frequency power to the first electrode, and a control unit controlling turning on or off of the first supply unit at a predetermined timing to thereby cause intermittent supply of the high frequency power, and controlling turning on or off of the second supply unit according to the timing of turning on or off of the first supply unit to thereby cause intermittent application of the DC negative pulse voltage.

One aspect of a substrate plasma processing method according to the present invention uses a substrate plasma processing apparatus which includes a chamber capable of maintaining a vacuum therein, a first electrode to hold a substrate in the chamber, the substrate being processed on a main surface thereof, a counter electrode arranged to face the first electrode in the chamber, a first supply unit configured to apply a high frequency power having a predetermined frequency of 50 MHz or higher to the first electrode, and a second supply unit configured to apply a predetermined DC negative pulse voltage in a manner of superimposing on the high frequency power to the first electrode, and the method includes turning on or off the high frequency power from the first supply unit at a predetermined timing to thereby cause intermittent application of the high frequency power, and turning on or off the second supply unit according to the timing of turning on or off of the high frequency power to thereby cause intermittent application of the DC negative pulse voltage.

BRIEF DESCRIPTION OF THE DRAWINGS

FIGS. 10A and 10B are charts showing a relationship between DC pulse voltage application and a state of charge-up.

DESCRIPTION OF THE EMBODIMENTS

Hereinafter, embodiments of a substrate plasma processing apparatus and a substrate plasma processing method according to the present invention will be explained with reference to the drawings. First, an embodiment of the substrate plasma processing apparatus will be explained with reference to FIG. 1.

Figure 1:
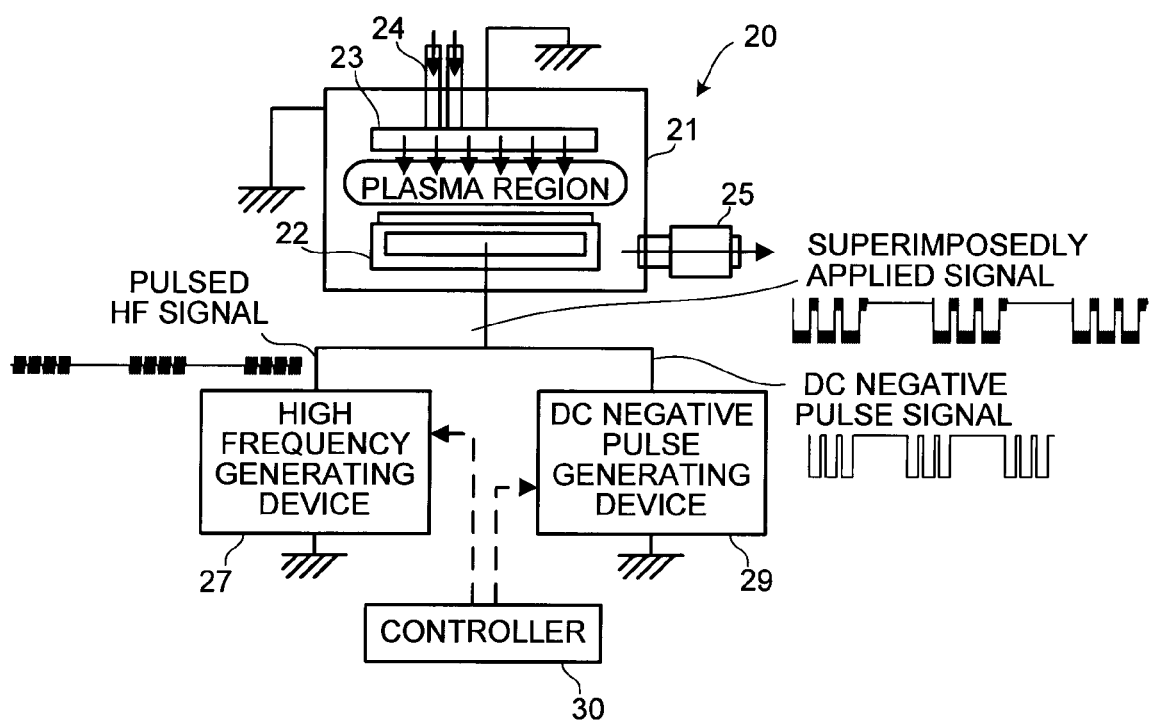
FIG. 1 is a diagram showing the structure of a substrate plasma processing apparatus according to an embodiment of the present invention.

As shown in FIG. 1, the substrate plasma processing apparatus 20 of this embodiment is a plasma processing apparatus of what is called a parallel plate type. In a chamber 21 capable of being evacuated to a predetermined degree of vacuum, a substrate holding electrode (high frequency (RF) electrode) 22 and a counter electrode 23 are arranged facing each other. A main surface of this substrate holding electrode 22 that faces the counter electrode 23 is structured to be capable of holding a substrate S to be subjected to processing. In the chamber 21, a gas introducing pipe 24 and an exhaust port 25 connected to a not-shown vacuum pump are provided. Then a gas to be used for generating plasma and thereby for processing the substrate S is introduced from the gas introducing pipe 24 into the chamber 21 as shown by arrows, and the inside of the chamber 21 is evacuated via the exhaust port 25.

As the above gas, besides a gas of Ar, Kr, Xe, $N_2$, $O_2$, CO, or $H_2$, for example, a process gas such as $SF_6$, $CF_4$, $CH_3F$, $C_2F_6$, $C_4F_8$, $C_5F_8$, $C_4F_6$, $Cl_2$, HBr, $SiH_4$, or $SiF_4$ can be used appropriately. Further, the pressure inside the chamber 21 can be set appropriately according to the processing rate for the substrate S and the type of a used gas, and for example can be kept at approximately a few Pa.

To the substrate holding electrode 22, a high frequency generating device 27 and a DC negative pulse generating device 29 are connected. Further, a controller 30 is connected to the high frequency generating device 27 and the DC negative pulse generating device 29, and this controller 30 controls operations of them. As its waveform being shown schematically in FIG. 1, the high frequency generating device 27 generates a pulsed high frequency power (HF) having a predetermined frequency of 50 MHz or higher, and a pulsed DC negative pulse voltage is generated from the DC negative pulse generating device 29. Then they are applied superimposedly to the substrate holding electrode 22.

Figure 2:
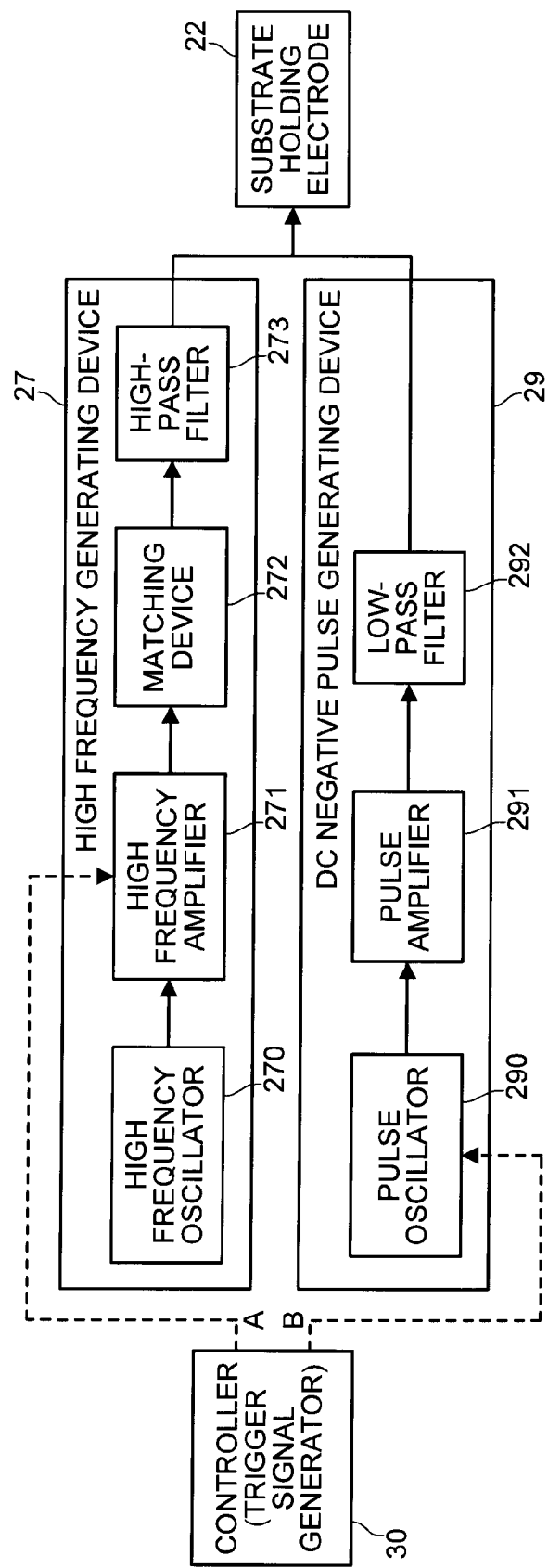
FIG. 2 is a diagram showing a substantial structure of the substrate plasma processing apparatus of FIG. 1.

FIG. 2 shows structures of the above-described high frequency generating device 27 and DC negative pulse generating device 29. As shown in this diagram, the high frequency generating device 27 includes a high frequency oscillator 270, a high frequency amplifier 271, a matching device 272, and a high-pass filter 273. In addition, it is possible that the high-pass filter 273 is included in the matching device 272.

Further, the DC negative pulse generating device 29 includes a pulse oscillator 290, a pulse amplifier 291, and a low-pass filter 292.

The controller 30 is formed by a trigger signal generator, and as shown by arrows in the diagram, a trigger signal A for the high frequency generating device 27 is inputted to the high frequency amplifier 271, and a trigger signal B for the DC negative pulse generating device 29 is inputted to the pulse oscillator 290. Then, the trigger signal A from the controller 30 causes the high frequency amplifier 271 to amplify the amplitude of a high frequency in a pulsed manner to thereby perform an on/off operation thereof. Further, the trigger signal B from the controller 30 causes the pulse oscillator 290 to perform an on/off operation of pulse generation. Then the amplified high frequency, which is passed through the matching device 272 and the high-pass filter 273 for blocking an LF signal, and the DC negative pulses on the other hand, which are amplified by the pulse amplifier 291 and passed through the low-pass filter 292 for preventing reverse flow of signal, are applied superimposedly to the substrate holding electrode 22. The trigger signal A for high frequency generation control and the trigger signal B for DC negative pulse generation control are synchronized and controlled in timing in the controller 30.

Figure 3:
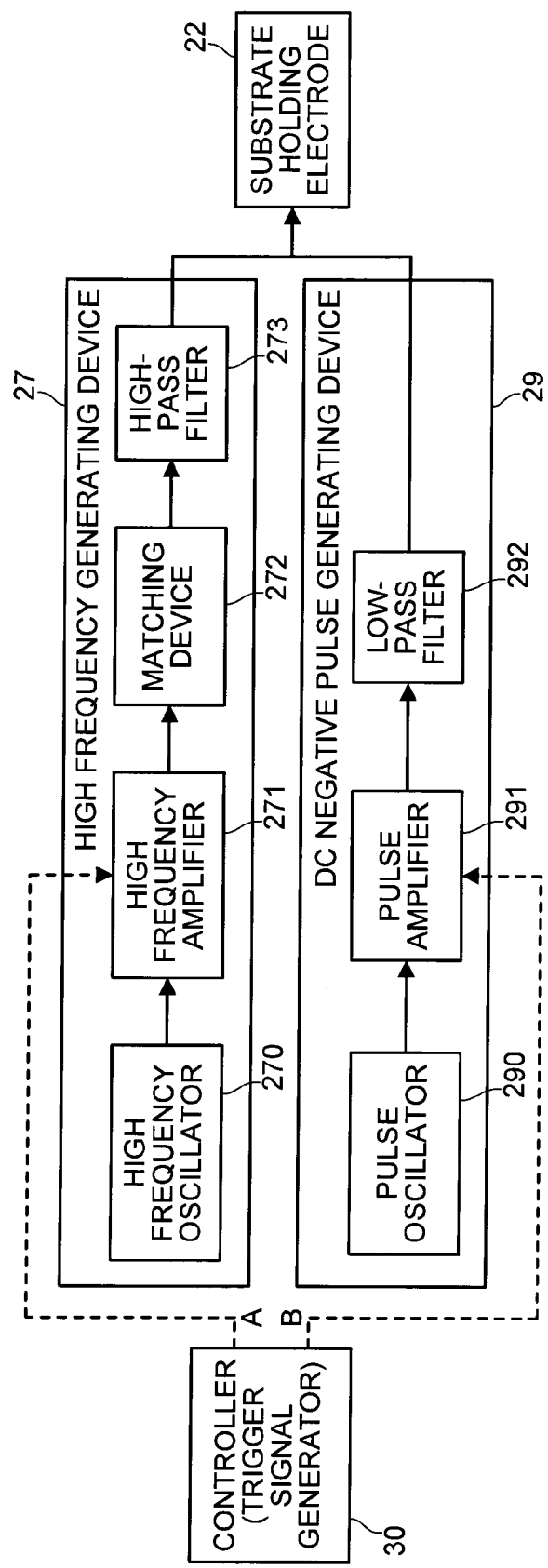
FIG. 3 is a diagram showing the structure of a modification example of the substantial structure of the substrate plasma processing apparatus of FIG. 1.
Figure 4:
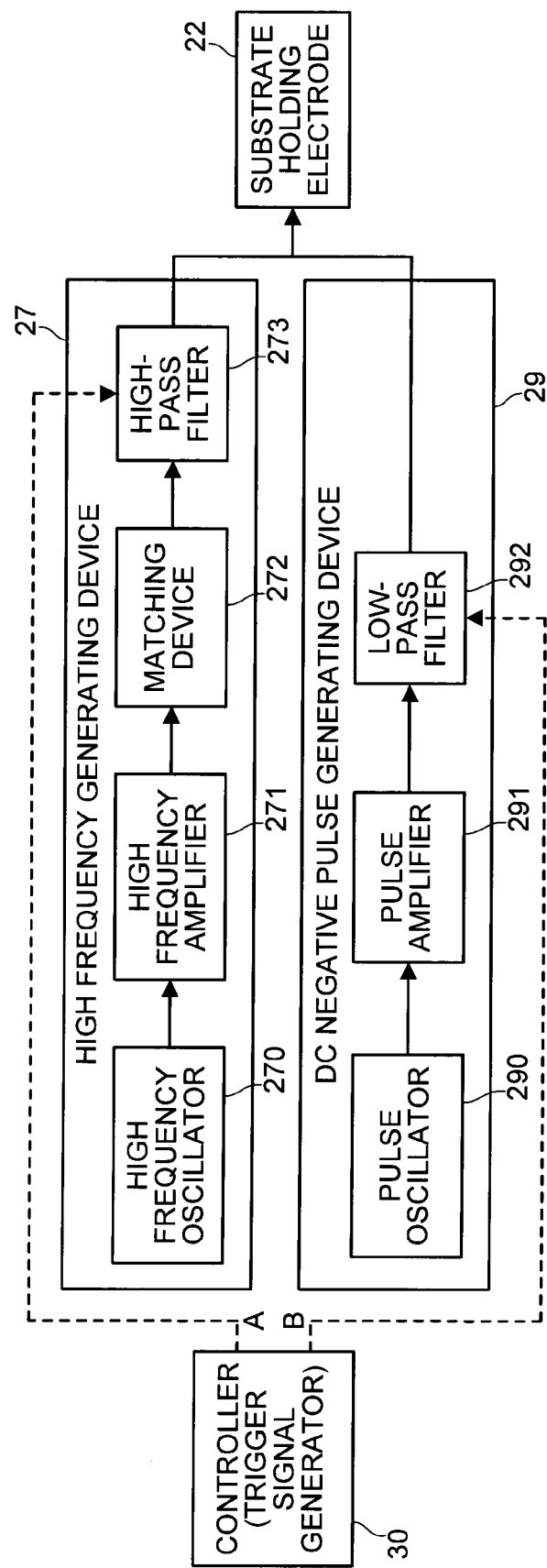
FIG. 4 is a diagram showing the structure of a modification example of the substantial structure of the substrate plasma processing apparatus of FIG. 1.

Control of on/off operations of the high frequency and DC negative pulses by the controller 30 as described above may be performed as shown in FIG. 3 or FIG. 4. In the case shown in FIG. 3, the trigger signal A from the controller 30 causes the high frequency amplifier 271 to amplify a high frequency amplitude in a pulsed manner to thereby perform an on/off operation thereof. Further, the trigger signal B from the controller 30 causes the pulse amplifier 291 to amplify a pulse amplitude in a pulsed manner to thereby perform an on/off operation. Further, in the case shown in FIG. 4, the trigger signal A from the controller 30 causes the high-pass filter 273 to turn to an HF passing operation. Further, the trigger signal B from the controller 30 causes the low-pass filter 292 to turn to a pulse passing operation. Cutting or passing of signals in the filters is performed by a variation of a variable element such as a capacitor or coil in the filters. Thus, control of on/off operations of the high frequency and DC negative pulses is performed.

Besides them, although not shown, the combination of control positions can be selected freely for the trigger signal A from the controller 30 to control one of the high frequency oscillator 270, the high frequency amplifier 271, and the high-pass filter 273 to cause an on/off operation of the high frequency power and for the trigger signal B from the controller 30 to control one of the pulse oscillator 290, the pulse amplifier 291, and the low-pass filter 292 to cause an on/off operation of the DC negative pulse voltage.

Further, it is also possible that one of the high frequency oscillator 270, the high frequency amplifier 271, and the high-pass filter 273 has an external trigger function, and a trigger signal B therefrom synchronously controls one of the pulse oscillator 290, the pulse amplifier 291, and the low-pass filter 292, or that one of the pulse oscillator 290, the pulse amplifier 291, and the low-pass filter 292 has an external trigger function, and a trigger signal A therefrom synchronously controls one of the high frequency oscillator 270, the high frequency amplifier 271, and the high-pass filter 273. Further, off operations of the high frequency and the DC negative pulses are preferred to be on/off operations in a pulsed manner, but the off operations may be amplitude varying operations which are different pulse-wise by ten times or more from the on operations.

When substrate plasma processing is performed by the substrate plasma processing apparatus 20 having the above structure, a 300 mm wafer for example as the substrate S on which a resist mask is formed is mounted on the substrate holding electrode 22. Next, the chamber 21 is evacuated and a $CF_4$ gas for example as the predetermined processing gas is supplied from the counter electrode (shower head) 23 at a predetermined flow rate, 200 sccm for example. Then the degree of vacuum in the chamber 21 is adjusted to a predetermined pressure, 2.66 Pa for example, by a not-shown exhaust valve. Onto the substrate holding electrode 22 on which the wafer is mounted, the high frequency from the high frequency generating device 27 and the DC negative pulses from the DC negative pulse generating device 29 are applied superimposedly as shown in the block diagram of FIG. 1 and the timing chart of FIG. 5.

Figure 5:
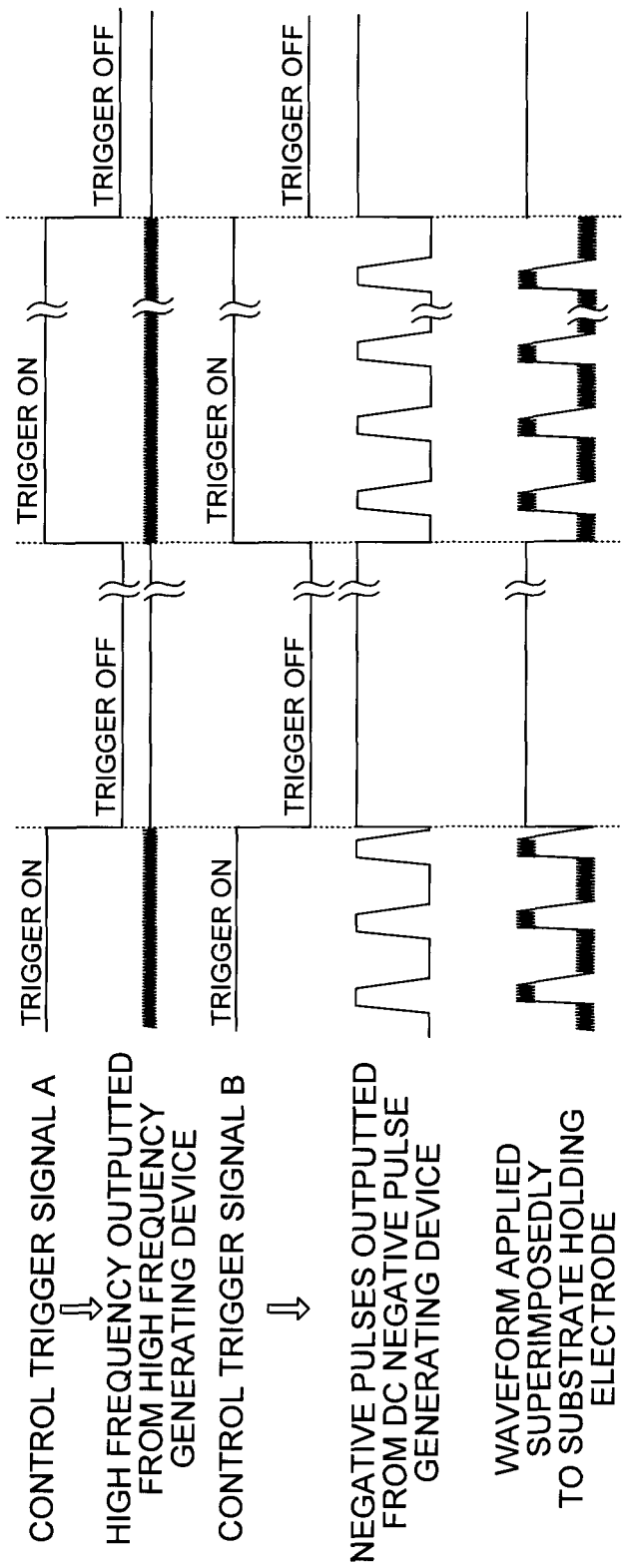
FIG. 5 is a chart showing timing of voltage application in the substrate plasma processing apparatus of FIG. 1.

The high frequency from the high frequency generating device 27 has a predetermined frequency of 50 MHz or higher, and for example a high frequency of 100 MHz and 100 V is used. As shown in FIG. 5, this high frequency is on/off controlled at 50 μs intervals upon reception of the trigger signal A with a predetermined period and predetermined duty ratio, for example a 10 kHz period and 50% duty ratio, from the controller 30. Further, from the DC negative pulse generating device 29, DC negative pulses are generated with a predetermined repetition period and predetermined duty ratio, for example with a 1 MHz repetition period, 80% duty ratio, and −500 V, and these DC negative pulses are on/off controlled at 50 μs intervals upon reception of the trigger signal B synchronized with the trigger signal A. As shown at the lowest part of FIG. 5, these signals are applied superimposedly to the substrate holding electrode 22. In the timing chart shown in FIG. 5, the DC negative pulses are turned on at the same time as turning on of the high frequency, and the DC negative pulses are turned off at the same time as turning off of the high frequency.

Figure 7A:
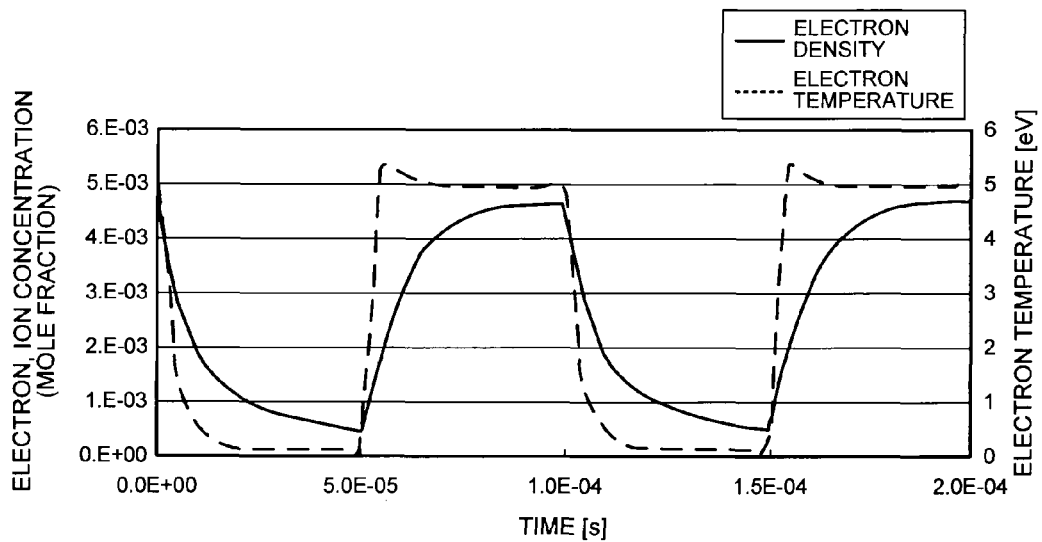
FIG. 7A is a chart showing simulation results of time variations of electron density and electron temperature in the embodiment.
Figure 7B:
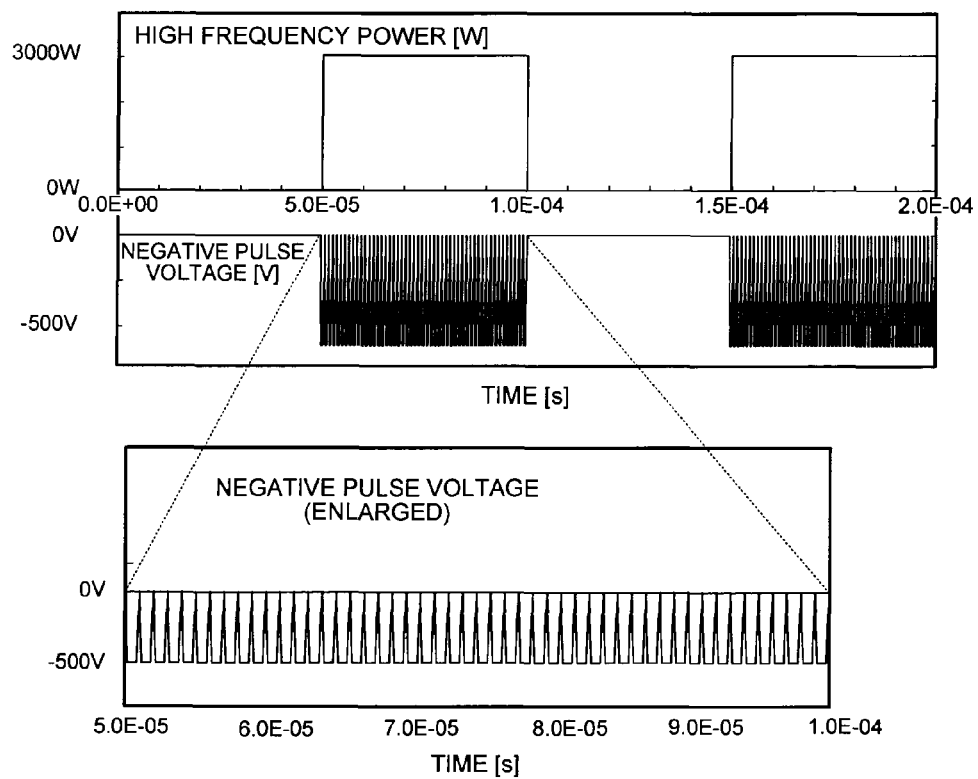
FIG. 7B is a chart showing high frequency power and a negative pulse voltage and an enlarged time axis thereof.
Figure 8A:
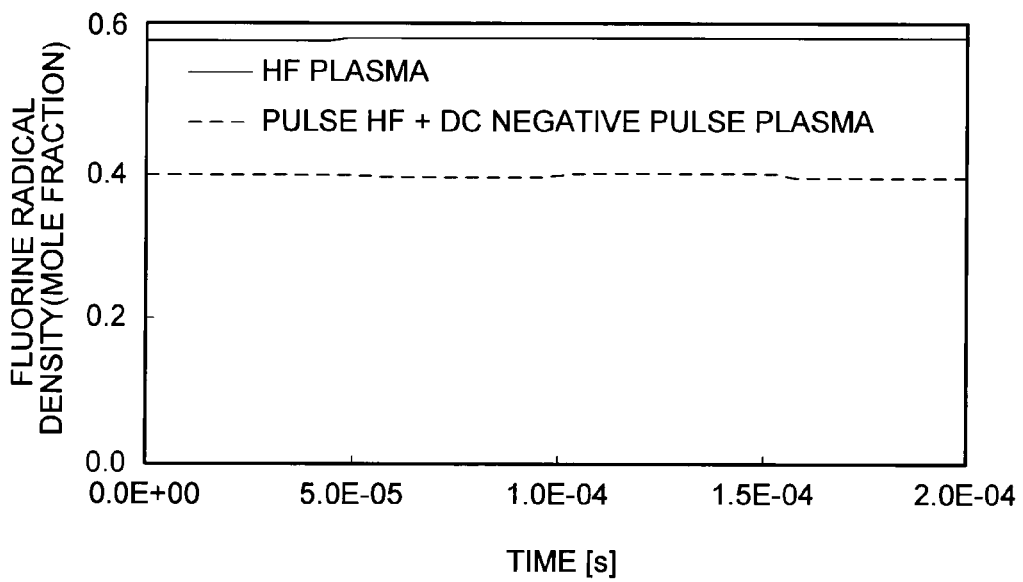
FIG. 8A is a chart showing fluorine radical density in the embodiment.
Figure 8B:
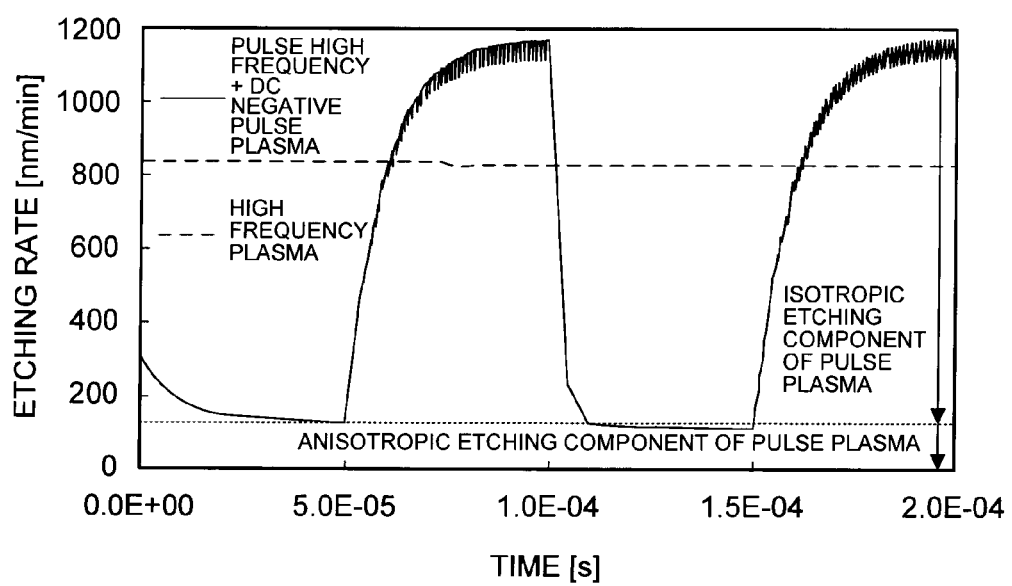
FIG. 8B is a chart showing simulation results of etching rate in the embodiment.

FIG. 7A shows time variations of the electron density and electron temperature when the pulsed high frequency and the DC negative pulses are applied superimposedly as described above. In addition, FIG. 7B shows high frequency power and a negative pulse voltage and an enlarged time axe thereof. Further, FIGS. 8A and 8B show results of comparing the case of superimposedly applying the above-described pulsed high frequency and DC negative pulses and the case of typical high frequency plasma with respect to time variations of fluorine radical density and silicon substrate etching rate. In addition, these results are from simulating anisotropic etching rates of silicon oxide film by a $CF_4$ gas system using CHEMKIN made by Reaction Design. As chemical reaction models, models by Paulin Ho, et al. (J. Vac. Sci. Technol. A (2001)) are used.

As shown in FIG. 7A, when the pulsed high frequency and DC negative pulses are applied superimposedly as in the timing chart shown in FIG. 5, stable plasma is generated. That is, as described above, the electron temperature lowers quickly (by $5 \times 10^{-6}$ seconds or shorter) as the high frequency power (HF) turns off, and generation of ions and electrons by electronic collision and ionization stops. In this what is called an afterglow state, when the DC negative pulses are applied, electrons and ions in the plasma are drawn out of the plasma, and the plasma becomes unstable and disappears. The disappearance of the plasma then causes reduction of the process rate, device damage when reignition, and process unstabilization. On the other hand, as shown in the timing chart of FIG. 5, in this embodiment, the DC negative pulses are turned on at the same time as turning on of the high frequency, and the DC negative pulses are turned off at the same time as turning off of the high frequency. Thus, the DC negative pulses will not be applied in the state of afterglow, and stable plasma is generated.

Further, as shown in FIG. 8A, along with lowering of the electron temperature (lowering of average electron temperature) when the high frequency is turned off, the neutral fluorine radical density which deteriorates the processing shape by isotropic etching decreases. As shown in FIG. 8B, only when the high frequency pulses and the DC negative pulses are applied, anisotropic etching of a silicon oxide film with less isotropic components providing an excellent processing shape was realized by cations with uniform energy widths (that is, the band thereof is narrowed). Further, in the system of etching to form a protective film, when the high frequency pulses and DC negative pulses are turned off, formation of the protective film occurs with no isotropic etching at all.

Figure 9:
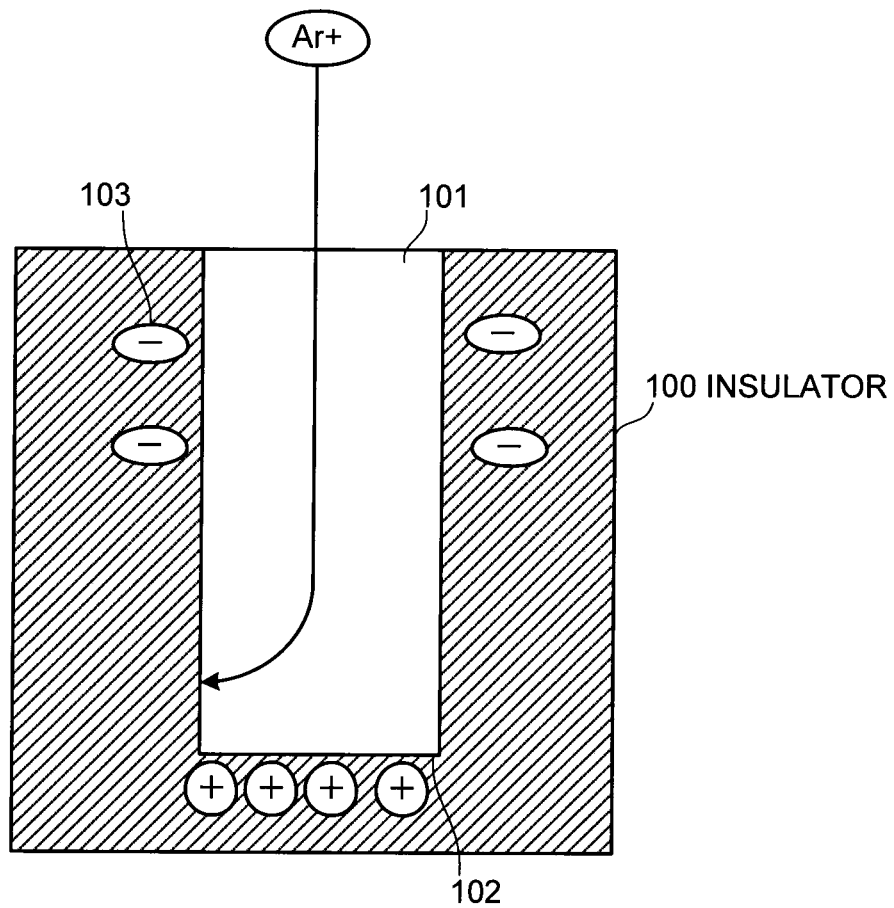
FIG. 9 is a diagram for explaining occurrence of a charge-up.
Figure 11:
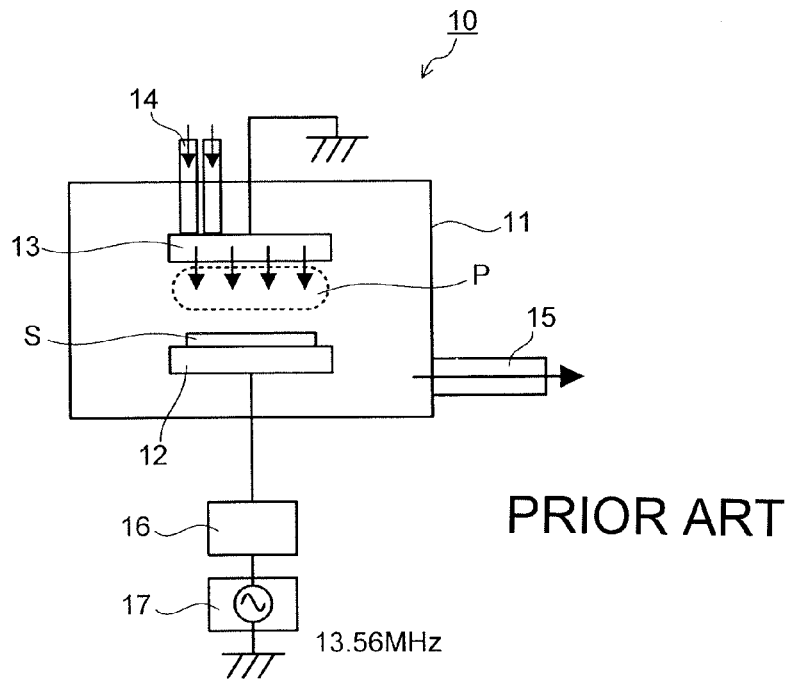
FIG. 11 is a diagram showing the structure of a plasma processing apparatus of parallel plate type.
Figure 12:
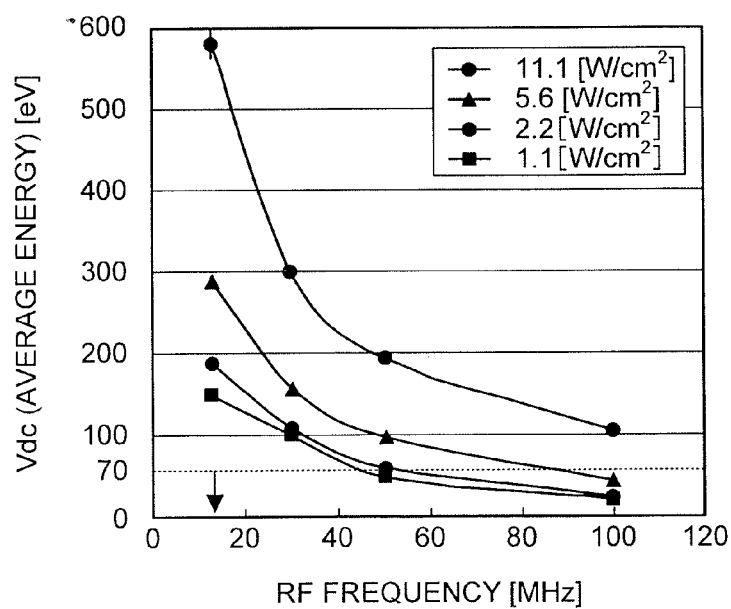
FIG. 12 is a chart showing a relationship between RF power and a frequency and Vdc.
Figure 13:
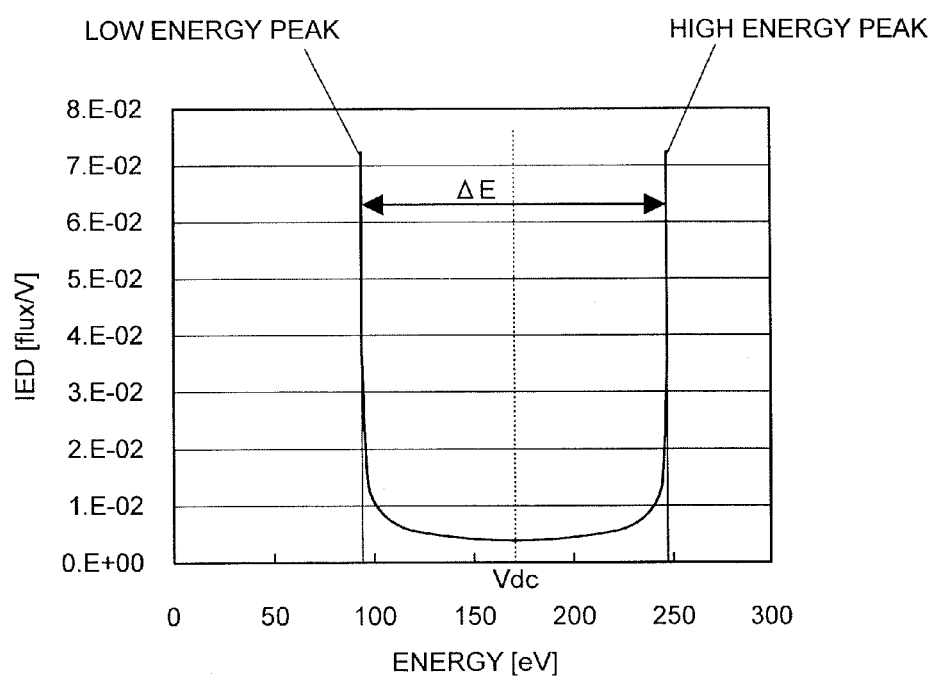
FIG. 13 is a graph showing a distribution of incident energy of ions into a substrate.
Figure 14:
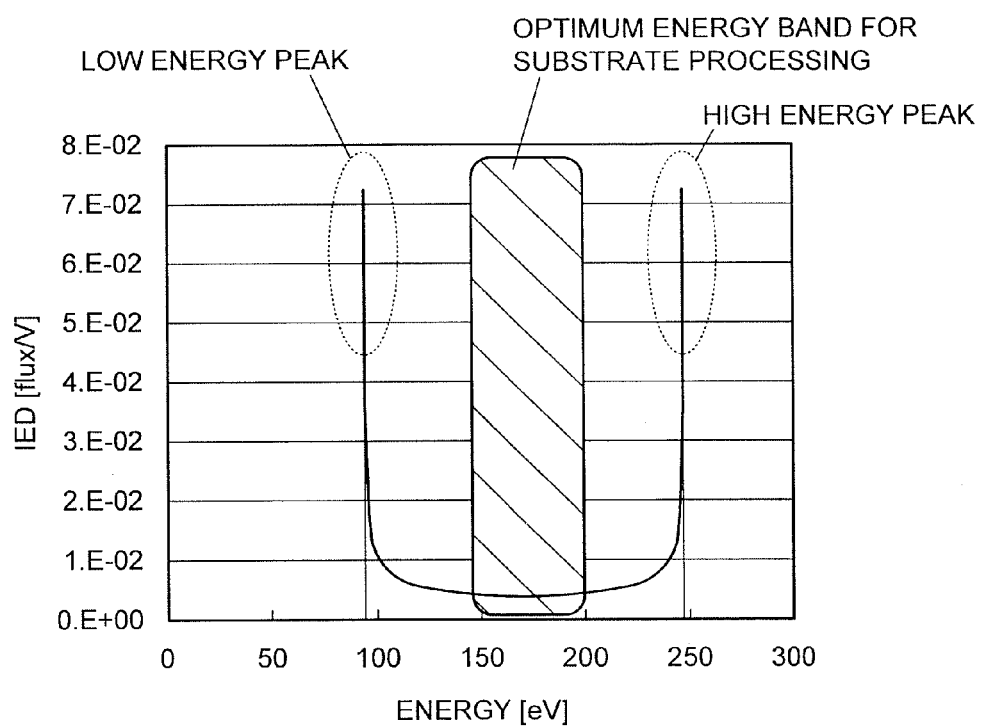
FIG. 14 is a graph showing a distribution state of ion energy suitable for a substrate.

Further, as shown in FIG. 9, when an insulator 100 is etched with plasma in which DC negative pulses are superimposed, there occurs a small flux of electrons showering in an isotropic manner on a bottom portion 102 of a trench 101 having a large aspect ratio, and thus a positive charge build-up (charge-up) occurs in the insulator 100 on the bottom portion 102. Low energy ions decrease when the DC negative pulses are used, and thus the charge-up increases further. In addition, in an upper side wall 103 of the trench 101, a negative charge-up (instantaneous) occurs by an excessive electron flux. Accordingly, by the charge-up in the bottom portion 102 of the trench 101, the path of incident positive ions are deflected and the anisotropy deteriorates. Consequently, deterioration of processing accuracy, deterioration of an embedding characteristic, and etching stop occur, thereby causing damage. Note that FIG. 9 shows only the case where the entire body is the insulator 100, but it will be the same in the case where only the bottom portion is an insulator. Such a charge-up proceeds when the high frequency is stopped, and when the high frequency is present, it is alleviated or eliminated by ions and/or electrons with low energy.

As shown in the timing chart of FIG. 5, in this embodiment the DC negative pulses are turned on at the same time as turning on of the high frequency, and the DC negative pulses are turned off at the same time as turning off of the high frequency. Thus, it will not happen that only the DC negative pulses are applied during the high frequency is stopped, and occurrence of the charge-up as described above can be suppressed.

Further, in this case, the charge-up is alleviated and eliminated by ions and electrons with low energy by application of the high frequency when application of the DC negative pulses is halted and only the high frequency is applied. That is, as shown in the timing chart of FIG. 6, the charge-up in the trench portion is alleviated by halting application of the DC negative pulses a predetermined time $T_{pre}$ before the time of turning off of the high frequency.

FIGS. 10A and 10B show that charge-up alleviation occurs as shown in FIG. 10B in the case where the DC negative pulses are applied intermittently as compared to the case where the DC negative pulses are applied sequentially as shown in FIG. 10A. As shown in these FIGS. 10A and 10B, when the number of sequentially applied DC negative pulses is $n_1$, pulse application time is $t_1$ (seconds), and pulse halt time is $t_3$ (seconds), for preventing charge-up damage it is necessary that:

(1) charge amount $Y \cdot n_1 Z e B N_i v_b t_i$ per unit area that builds up during a sequential DC negative pulse application time ($n_1 \times t_1$ (seconds)) synchronized with the high frequency pulses is suppressed equal to or less than an insulation limit charge amount $Q_{max}$ per unit area; and (2) to prevent occurrence of charge-up damage by charge accumulation due to charge-up when DC negative pulses are applied thereafter, charge alleviation amount $ZeBN_iv_bT_{pre}$ per unit area during application time ($T_{pre}$ (seconds)) of only the high frequency is equal to or larger than $Q_{max}$. That is, it is necessary to control $n_1$, $t_1$, and $T_{pre}$ so as to satisfy the following expressions.

$$Y \cdot n_1 ZeBN_i v_b t_1 \leq Q_{max} \quad (1)$$

$$Q_{max} = V_{max} * (\in_0 \in_s / d) \quad (2)$$

Here, $\in_0$ is dielectric constant of vacuum, $\in_s$ is relative dielectric constant of a trench bottom portion insulating material to be processed, Z is ionic valency, $v_b$ is Bohm speed as $v_b = (kT_e/M_i)^{1/2}$, $T_e$ is electron temperature, k is Boltzmann's constant, $M_i$ is ion mass, d is bottom portion insulating film thickness, $v_{max}$ is withstand voltage, B is plasma density ratio of a sheath end portion and a bulk portion ($\approx$0.605), Y is ratio concerning charge accumulation when positive ions are incident, e is elementary electric charge, and $N_i$ is ion density.

Taking processing of a gate oxide film as an example, when a gate width 50 nm, d=10 nm, and a typical destruction withstand voltage 10 MV/cm of an oxide film are used, $V_{max}$=10 V and $Q_{max}$=3.54×10$^{-2}$ [C/m$^2$] hold true. From expression (2), $T_{pre} \geq 5.18$ [μs] holds true.

Further, in the case of DC pulses with a repetition frequency of 1 MHz ($t_1$=1 μs) and 80% duty ratio, Y≈0.6 is estimated when adding the duty ratio, resulting in $Y \cdot ZeBN_i v_b t_1$ in expression (1)=3.28×10$^{-3}$ [C/m$^2$]. Specifically, when $t_1 \cdot n_1 \leq 10.8$ μs and the repetition period of the high frequency pulses of 50% duty ratio is 50 kHz or larger, expression (1) is satisfied and no damage will be caused.

Figure 6:
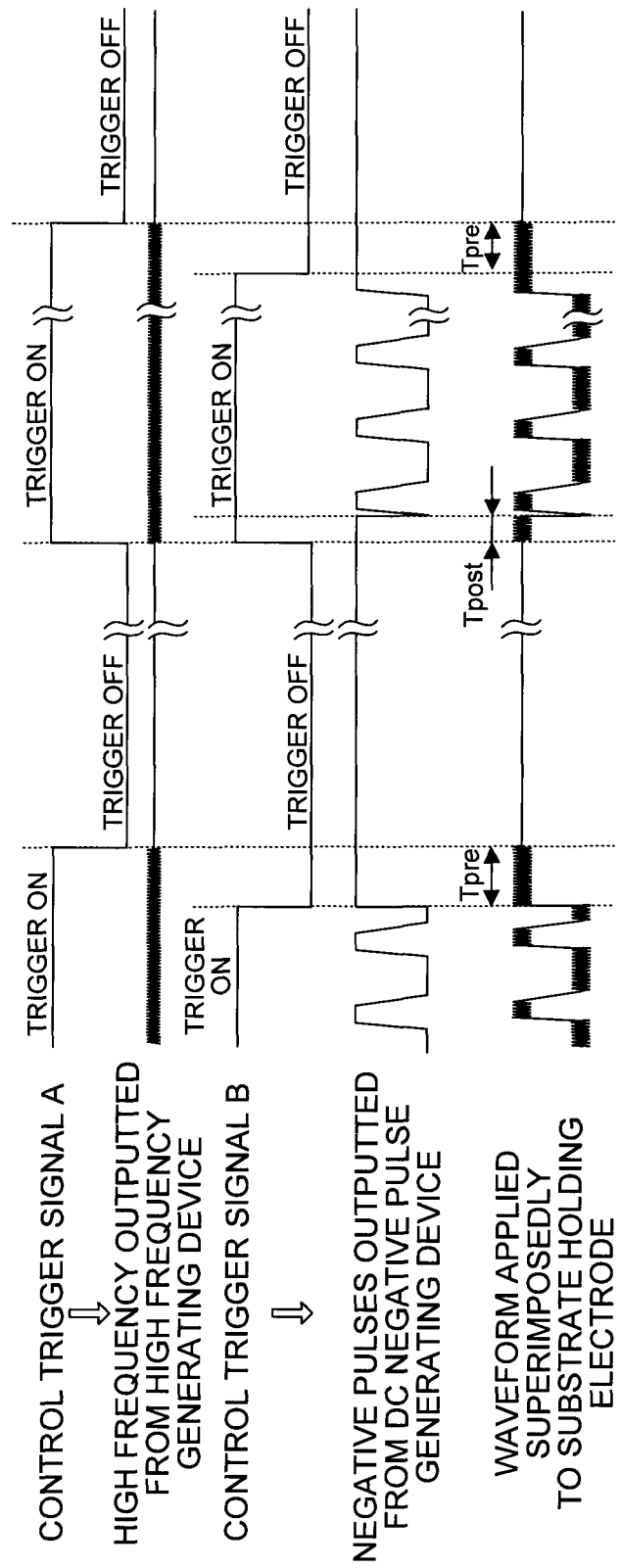
FIG. 6 is a chart showing timing of voltage application in the substrate plasma processing apparatus of FIG. 1.

Further, as shown in FIG. 7A, a recovery time of approximately 2 μs is required for allowing, by turning on of the high frequency, the electron temperature to recover to ½ of that when the high frequency is applied steadily. When the DC negative pulses are turned on before the electron temperature recovers, the plasma may become unstable. Then it is possible that the plasma disappears instantaneously, and inrush current stress when reigniting may cause damage to the device. Accordingly, as shown in FIG. 6, for recovery and stabilization of plasma, the DC negative pulses are turned on when approximately 4 μs ($T_{post}$) passes after the high frequency is turned on, and thereby the plasma is stabilized further.

Further, changing of the above $T_{pre}$ time, $T_{post}$ time, as well as pulse time $T_1$, number of pulses $n_1$, and duty ratio of DC negative pulses, and pulse frequency and duty ratio of HF according to the progress and switching of the plasma substrate processing process is effective for suppression of damage to the device, processing shape control, radical density control, and increase of the process rate.

It should be noted that the present invention is not limited to the above-described embodiments, and as a matter of course, various modifications can be made. Further, the embodiments of the present invention can be extended or changed within the scope of the technical idea of the present invention, and these extended and/or modified embodiments are to be included in the technical scope of the present invention. Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate plasma processing apparatus, comprising:
a chamber capable of maintaining a vacuum therein;
a first electrode to hold a substrate in the chamber, the substrate being processed on a main surface thereof;
a counter electrode arranged to face the first electrode in the chamber;
a first supply unit configured to apply a high frequency power having a predetermined frequency of 50 MHz or higher to the first electrode;
a second supply unit configured to apply a predetermined DC negative pulse voltage in a manner of superimposing on the high frequency power to the first electrode;
a control unit configured to periodically turn on and off both of the first and second supply units so as to repeat in sequence a first period, a second period, and a third period, in the first period both of the high frequency power and the DC negative pulse voltage being applied to the first electrode, in the second period only the high frequency power being applied to the first electrode, and in the third period none of the high frequency power and the DC negative pulse voltage being applied to the first electrode.

2. The apparatus according to claim 1,
wherein when plasma processing an insulating film or a film having an insulator on a bottom portion, the period is a preset charge-up alleviation time $T_{pre}$,
where $T_{pre} \geq Q_{max}/(ZeBN_iv_b)$, $Q_{max}$ is a maximum charge amount per unit area that does not cause damage, Z is ionic valency, $v_b$ is Bohm speed as $v_b=(kT_e/M_i)^{1/2}$, $T_e$ is electron temperature, k is Boltzmann's constant, $M_i$ is ion mass, B is plasma density ratio of a sheath end portion and a bulk portion, e is elementary electric charge, and $N_i$ is ion density.

3. The apparatus according to claim 2,
wherein the period is equal to or larger than 5.18 microseconds.

4. The apparatus according to claim 1,
wherein the control unit periodically turns on the second supply unit so as to repeat in sequence the fist period, the second period, the third period, and a fourth period, in the fourth period only the high frequency power being applied to the first electrode.

5. The apparatus according to claim 4,
wherein the second period is equal to or larger than 4 microseconds.

* * * * *